United States Patent [19]

Huang

[11] Patent Number: 5,028,922
[45] Date of Patent: Jul. 2, 1991

[54] MULTIPLEXED ENCODER AND DECODER WITH ADDRESS MARK GENERATION/CHECK AND PRECOMPENSATION CIRCUITS

[75] Inventor: Po C. Huang, Taipei, Taiwan

[73] Assignee: Industrial Technology Research Institute, Chutung, Taiwan

[21] Appl. No.: 429,217

[22] Filed: Oct. 30, 1989

[51] Int. Cl.$^5$ .......................... H03M 7/00; G11B 5/09
[52] U.S. Cl. ........................................ 341/59; 360/48; 341/56
[58] Field of Search ...................... 341/50, 56, 59, 58; 360/45, 46, 48

[56] References Cited

U.S. PATENT DOCUMENTS

| | | | |
|---|---|---|---|
| 4,118,791 | 10/1978 | Swain | 341/56 |
| 4,373,152 | 2/1983 | Jacobsthal | 341/56 |
| 4,420,771 | 12/1983 | Pirsch | 341/56 |
| 4,551,773 | 11/1985 | Cohn et al. | 360/48 |
| 4,651,237 | 3/1987 | Williams | 360/48 |
| 4,691,254 | 9/1987 | Cloke | 360/46 |
| 4,728,929 | 3/1988 | Tanaka | 341/73 |
| 4,841,299 | 6/1989 | Wraver | 341/59 |
| 4,884,074 | 11/1989 | Nourry et al. | 341/68 |

Primary Examiner—William M. Shoop, Jr.
Assistant Examiner—Helen Kim
Attorney, Agent, or Firm—Darby & Darby

[57] ABSTRACT

A two-level multiplexed encoder/decoder based on a novel technique of code table compression is disclosed. By means of comparing various code conversion tables such as well-known tables for use in NRZ-MRM, NRZ-RLL conversion schemes, separate code word condition sets are obtained. In accordance with the code word condition sets thus obtained, a two-level multiplexed encode and decode logic can be easily constructed. The code word condition sets representing the compressed code relations are sensed in the first level and are used further to set up the operation of a connected network of a multiplexed logic circuit in the second level. The AM generation/check and precompensation circuit necessary for the encoder and decoder are incorporated as an integral part. This method is applicable when more than two code tables are needed to be integrated in a single encoder/decoder.

15 Claims, 13 Drawing Sheets

| ENCODE | | | DECODE | |
|---|---|---|---|---|
| $NRZ_{n-1}$ | $NRZ_n$ | $MFM_n$ | NRZ | MFM |
| 1 | 0 | 0 0 | 0 | 0 0 |
| 0 | 0 | 1 0 | 0 | 1 0 |
| X | 1 | 0 1 | 1 | 0 1 |
| | | $Q_1 Q_2$ | $Q_0$ | |

$C_{00} \rightarrow Q_1 = 1$      $C_{01} \rightarrow Q = 1$ $C_1 \rightarrow Q_0 = 1$ ENCODE COMPRESSED          DECODE COMPRESSED
RELATIONS                            RELATIONS

FIG. 5(b)

| ENCODE | | | | DECODE | | |
|---|---|---|---|---|---|---|
| NRZ | 2,7 RLL-1 | | | NRZ | 2,7 RLL-1 | |
| 0 0 0 | | 0 0 0 1 | 0 0 | 0 | 0 0 | 0 0 0 1 0 0 |
| 1 0 | | 0 1 | 0 0 | | 1 0 | 0 1 0 0 |
| 0 1 0 | | 1 0 0 1 | 0 0 | 0 | 1 0 | 1 0 0 1 0 0 |
| 0 0 1 0 | 0 0 | 1 0 0 1 | 0 0 | 0 0 | 1 0 | 0 0 1 0 0 1 0 0 |
| 1 1 | | 1 0 | 0 0 | | 1 1 | 1 0 0 0 |
| 0 1 1 | | 0 0 1 0 | 0 0 | 0 | 1 1 | 0 0 1 0 0 0 |
| 0 0 1 1 | 0 0 | 0 0 1 0 | 0 0 | 0 0 | 1 1 | 0 0 0 0 1 0 0 0 |
| | | $Q_3 Q_2 Q_1 Q_0$ | | | $Q_1 Q_0$ | |

FIG. 5(c)

| ENCODE | | | | DECODE | | |
|---|---|---|---|---|---|---|
| NRZ | 2,7 RLL-2 | | | NRZ | 2,7 RLL-2 | |
| 0 0 0 | | 1 0 0 1 | 0 0 | 0 | 0 0 | 1 1 1 0 0 1 0 0 |
| 1 0 | | 1 0 | 0 0 | | 1 0 | 1 0 0 0 |
| 0 1 0 | | 0 0 1 0 | 0 0 | 0 | 1 0 | 0 0 1 0 0 0 |
| 0 0 1 0 | 0 0 | 0 0 1 0 | 0 0 | 0 0 | 1 0 | 0 0 0 0 1 0 0 0 |
| 1 1 | | 0 1 | 0 0 | | 1 1 | 0 1 0 0 |
| 0 1 1 | | 0 0 0 1 | 0 0 | 0 | 1 1 | 0 0 0 1 0 0 |
| 0 0 1 1 | 0 0 | 1 0 0 1 | 0 0 | 0 0 | 1 1 | 0 0 1 0 0 1 0 0 |
| | | $Q_3 Q_2 Q_1 Q_0$ | | | $Q_1 Q_0$ | |

$C_{000} \rightarrow Q_3 = 1 \quad Q_0 = 1$ $C_{10} \rightarrow Q_1 = 1$ $C_{11} \rightarrow Q_0 = 1$ $C_{0011} \rightarrow Q_3 = 1$

ENCODE COMPRESSED RELATIONS $C_{1000} \rightarrow Q_1 = 1$ $C_{0100} \; C_{1110} \rightarrow Q_1 = 1 \quad Q_0 = 1$

DECODE COMPRESSED RELATIONS

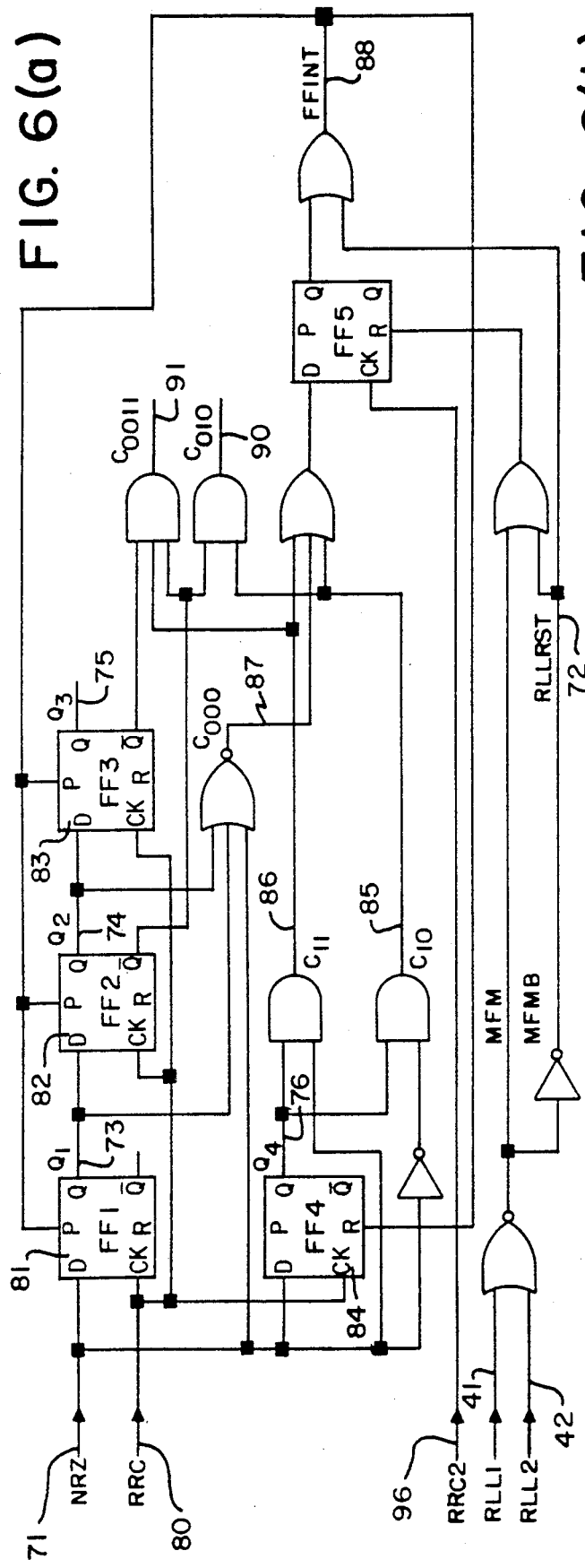
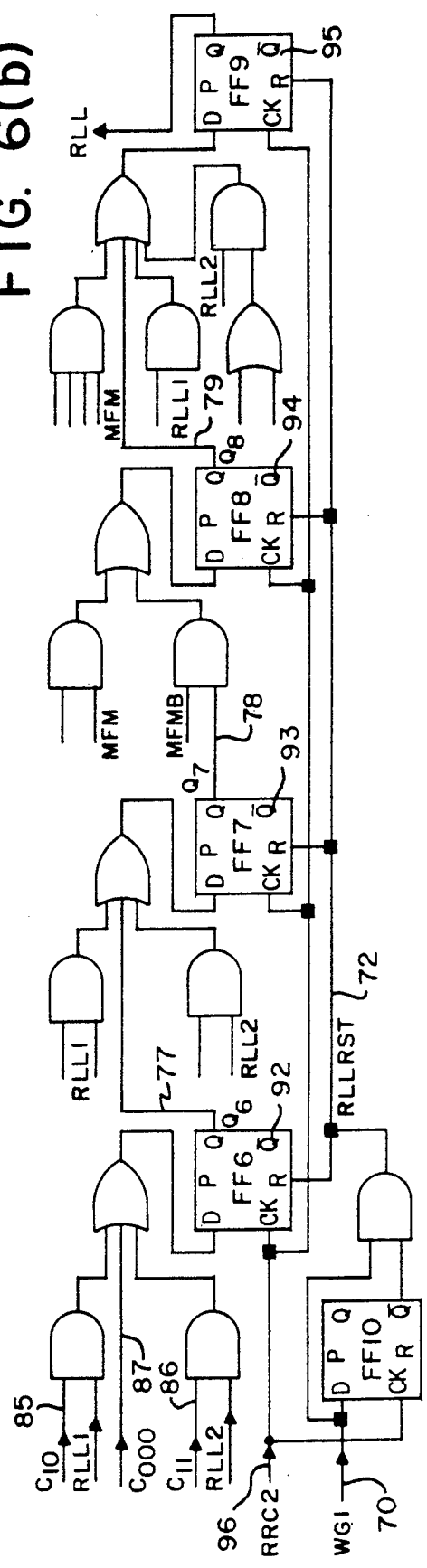
FIG. 6(a)
FIG. 6(b)

| CONDITION \ SIGNALS OUT | EARLY 34 | LATE 35 |
|---|---|---|
| EARLY | 1 | 0 |
| LATE | 0 | 1 |
| NORMAL | 0 | 0 |
| XXXX | 1 | 1 |

MULTIPLEXED ENCODER AND DECODER WITH ADDRESS MARK GENERATION/CHECK AND PRECOMPENSATION CIRCUITS

FIELD OF INVENTION

This invention relates to a two level multiplexed encoder and decoder based on a code compression technique which is applicable to different code table representations for MFM and RLL code conversion versus NRZ data interpretation. This encoder and decoder also incorporates the AM generation/check and precompensation circuit as an integral part.

BACKGROUND OF THE INVENTION

There are a number of encoding schemes used to record data on a disk. The encoding schemes are employed to minimize the number of transitions needed to represent data and, therefore, to increase the recording density of data stored on a mass storage device. In actual encoding process, parallel input data is first serialized and converted to a NRZ (non-return to zero) interpretation of the binary data bit pattern. The serialized NRZ data is then encoded according to a coding scheme such as MFM (modified frequency modulation) and RLL (run length limited). The encoded data are then recorded on the magnetic surface on the disk. When reading back the stored data, the encoded bit streams are decoded according to the same code conversion table used during encoding to obtain the original NRZ data.

A number of different implementations of the encoder and decoder to translate one code into another different code have been developed.

For instance, Adaptec Inc.'s disk controller includes a AIC-250 chip to provide code conversion for NRZ to and from MFM code. The same company developed another chip AIC-270 which provides NRZ to/from 2,7 RLL code conversion. Another commercialized encoder/decoder example is Western Digital Corp.'s WD1100-02 MFM generator which only converts NRZ data to and from MFM data symbols with corresponding write precompensation signals.

U.S. Pat. No. 4,691,254 discloses an encoder and decoder that employs a RLL code and has a write precompensation logic circuit.

All of the above devices provide single code conversion corresponding to a single coding scheme in the encoder and decoder.

U.S. Pat. No. 4,651,237 discloses a disk controller that utilizes a state machine having a stored program to manage the translation of multiple codes including MFM and RLL. This software approach for the code conversion in the disk controller could be too slow to cope with high-speed/high-volume heavy data transfer requirements.

For both economic reasons and efficient operation of code conversion, it has been attempted to provide an encoder and decoder capable of handling several different coding schemes for high speed disk storage devices without resorting to the use of extra components.

SUMMARY OF THE INVENTION

It is both economical and efficient to provide encoding and decoding capability for several different code conversion schemes in an encoder and decoder to be used in a disk data recording and retrieving control system.

This requirement is fulfilled by a novel two-level multiplexed encoder and decoder of the invention. Investigating those code tables that are already applied in various coding conversion schemes between the NRZ, MFM and RLL codes, it is possible to obtain an extracted code word condition set corresponding to each of those schemes. Upon detecting these code word condition sets in the first level logic circuit, a multiplexer circuit can be configured accordingly. Therefore, an encoder and decoder can be extended to incorporate any desirable code tables integrally with associated address mark generation and check and precompensation circuits.

BRIEF DESCRIPTION OF THE DRAWINGS

FIG. 4 shows a detailed block diagram of a decoder based on this invention;

FIGS. 5(a) through (c) show MFM, 2,7 RLL-1, 2,7 RLL-2 code tables and associated code word condition sets;

FIGS. 6(a) and (b) are detailed logic circuit diagrams of a two-level encoder, while

FIGS. 7(a) and (b) are detailed logic circuit diagrams of a two-level decoder, while

DESCRIPTION OF THE PREFERRED EMBODIMENT

Figure 1:
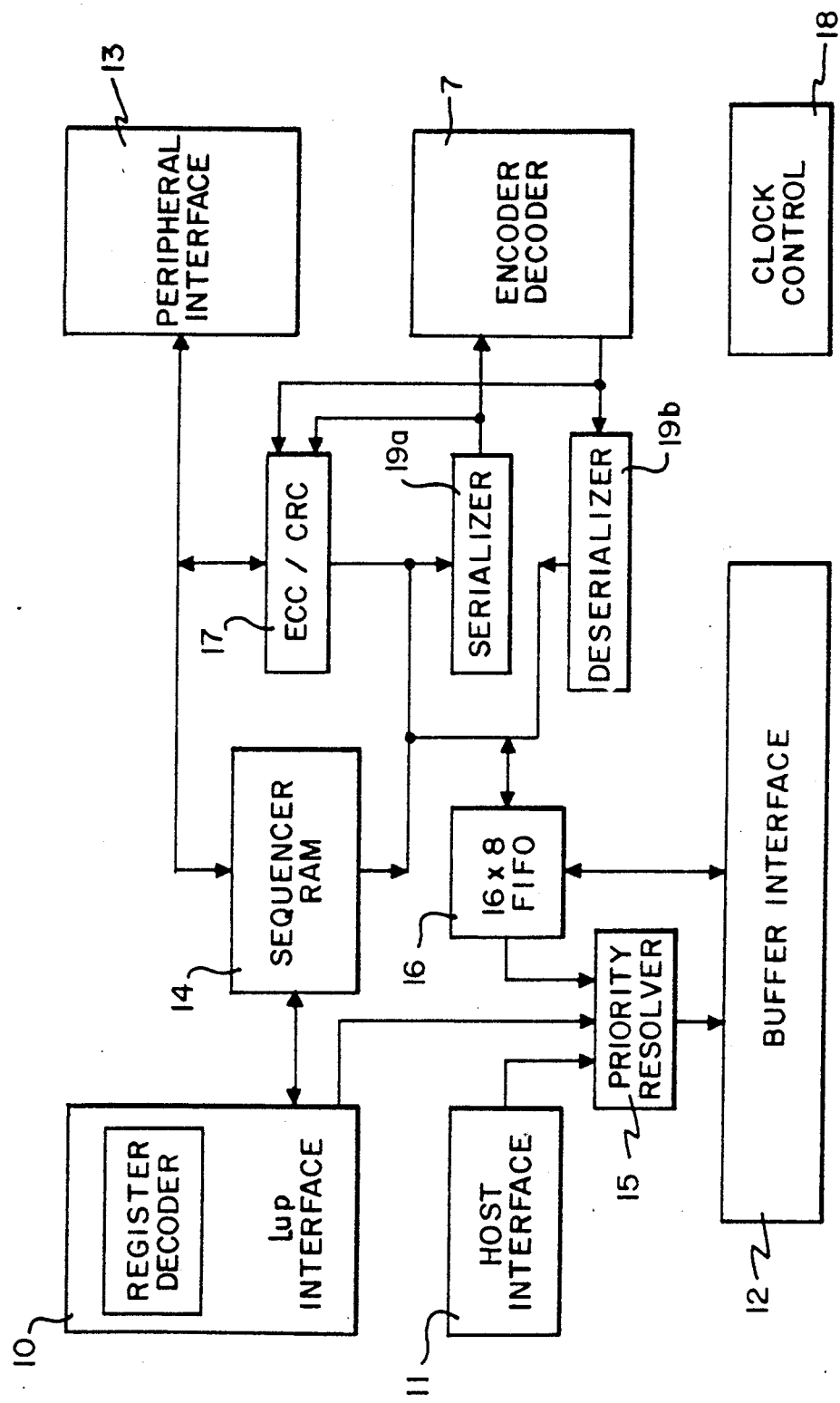
FIG. 1 shows major functional blocks related to the operation of an encoder and decoder in a disk controller.

Referring to FIG. 1, a disk controller is briefly described. It includes functional blocks such as the local processor (lup) interface 10, the host interface 11, buffer interface 12, peripheral interface 13, sequencer RAM 14, priority resolver 15, first-in-first-out memory (FIFO) 16, error correction code/cyclical redundancy check (ECC/CRC) 17, clock control 18, serializer/deserializer 19 and encoder/decoder 7.

The operation of a disk controller can be easily understood by considering the data transfer operation from the disk (not shown in FIG. 1), called the disk read operation and data transfer operation to the disk (called the disk write operation). In the disk read operation, the stored data in the disk (not shown) are read out and sent into the decoder 7 for decoding. The resultant serial data bits are then converted into parallel data bytes through the deserializer 19b. The data bytes are then compared by the sequencer RAM 14 for the correct data sector and are sent into the ECC/CRC block 17 to check for any errors incurred during the read back process.

In the disk write operation, the host (not shown) begins by sending a host cycle request to transfer data into the RAM buffer (not shown in FIG. 1). The RAM buffer data are sent into the FIFO 16 by sending the FIFO cycle request until the FIFO 16 is full. Whenever the FIFO 16 is empty, FIFO cycle requests are sent again. The data are also sent into the ECC/CRC 17 to generate the check bytes. The data bytes in the FIFO 16 are first sent into the serializer 19a for converting the parallel data bytes into bit streams, which are encoded through the encoder 7 to generate desired data coding format, such as MFM (modified frequency modulation) and RLL (run length limited) code. The encoded data are then written into the disk.

To facilitate the description of the embodiment of this invention, it is desirable that relevant details related to the operation of the invention are further described.

Figure 2:
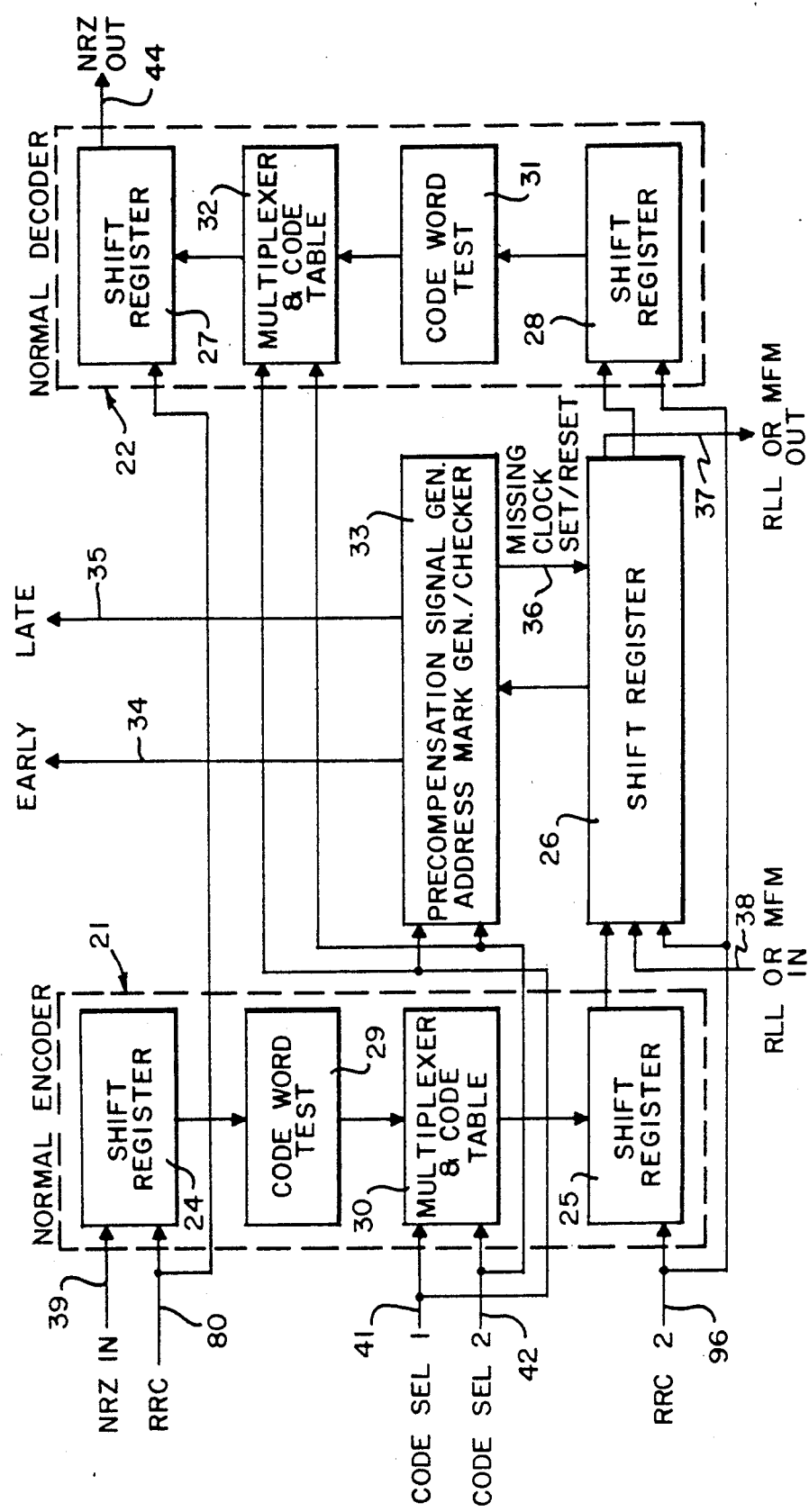
FIG. 2 shows a block construction of an encoder and decoder embodying the invention.

In FIG. 2 the building blocks of the encoder and decoder 7 in accordance with this invention are shown.

Referring to FIG. 2, the encoder 7 includes three parts, namely, the normal encoder 21, the address mark generator and write precompensation signal generator 33 and a common shift register 26.

The normal encoder 21 selects different encoding methods such as MFM, 2,7 RLL-1, 2,7 RLL-2 (detailed below) in response to two logic signals, namely, Code Sel 1 (41) and Code Sel 2 (42).

NRZ data received at an NRZ input 39 is shifted into a register 24 of the encoder 21 on the rising edge of a clock signal 80 called RRC controlling the register 24. The data thus shifted into the register 24 is encoded by a code word test 29 and a multiplexer and code table 30. The data thus encoded is stored in a register 25. The encoded data is shifted out of the register 25 and through the common register 26 to an output 37 in synchronism with a clock pulse signal 96 called RRC 2 controlling the register 25. The clock rate of RRC 2 is twice that of RRC. Simultaneously, the address mark generation and procompensation block 33 generates a missing clock set/reset signal 36 related to the address mark and Early and Late signals 34, 35 for use by a disk write/read precompensation circuit of the type well-known in the art.

In decoding, the RLL or MFM data signals 38 are shifted into the common shift register 26 for first detecting the attached address mark. Upon detection of the address mark by the address mark check block 33, the encoded data signals are shifted into the shift register 28 of the normal decoder 22 for decoding by a code word test 31 and a multiplexer and code table 32 and storage in a register 27. The decoded data signal, i.e., the original NRZ data signals, are shifted out of the register 27 at output 44.

The detailed structure of the normal encoder 21 and decoder 23 is described below. In particular, the code word test 29 and the multiplexer and code table 30 of the encoder 21 represent circuits depicted, respectively, in FIGS. 6(a) and (b), while the code word test 31 and the multiplexer and code table 32 of the decoder 22 represent circuits depicted, respectively, in FIGS. 7(a) and (b), discussed below.

The early and late signals 34, 35 are used in the well-known manner by a precompensation circuit (not shown) of the type well-known to shift (delay or advance) in time of recording of each bit on the disk, depending upon the immediate proximity of other bits and depending upon the type of code employed to record the data. The purpose is to compensate for magnetic interactions among neighboring bits (magnetic domains) on the disk. Such precompensation circuits and methods for operating them are well-known in the art.

Figure 3:
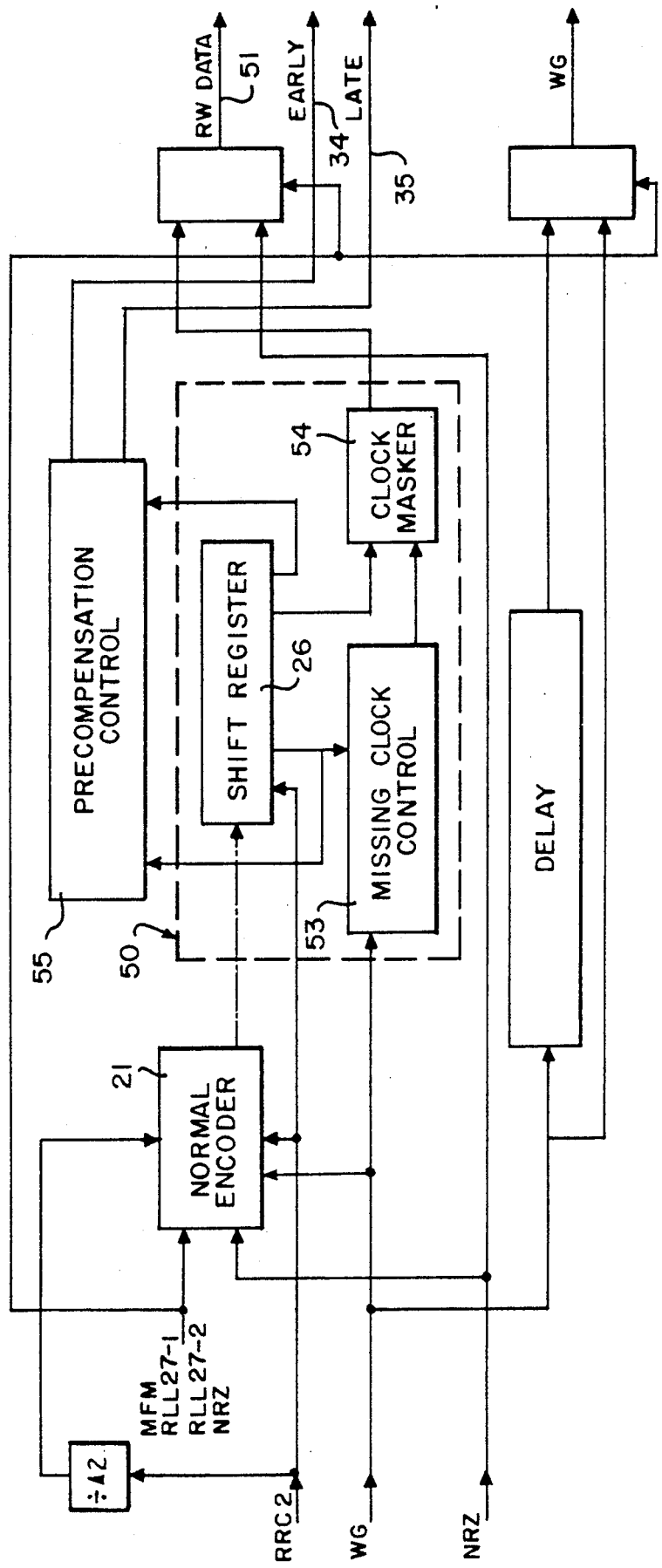
FIG. 3 shows a detailed block diagram of an encoder based on this invention.

FIG. 3 shows further details of the encoder, including the address mark generation/check and precompensation block 33. The output of the normal encoder 21 is not sent out to a RW DATA pin 51 until an address mark generator 50 generates a unique bit pattern to be appended to the encoded bit data. The address mark generator 50 is connected to the shift register 26, a missing clock control unit 53 and a clock masker 54. The missing clock control 53 will look for a special encoded pattern and inform the clock masker 54 to mask a bit which is in a specific location of the data string. By so doing, a unique pattern can be produced as an address mark which is subsequently identified in the send-back and decoding phase. (The address mark generation/check circuit 50 is described in detail below.)

The complete encoded bit string will then be shifted bit by bit through the shift register 26, which has sufficient residual bit locations to support write precompensation logic 55 for generation of the Early and Late signals 34, 35. (The precompensation logic 55 is described below.)

Figures 4, 5A:
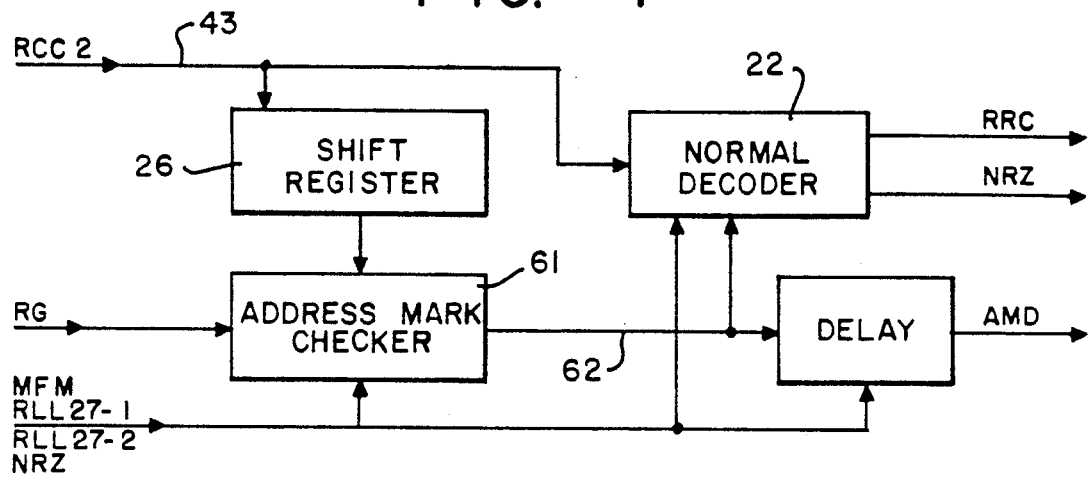

In FIG. 4, the decoder 7 contains an address mark checker 61, the normal decoder 22 and the common shift register 26.

The shift register 26 is used to sample and hold the encoded data and clock signals retrieved from the disk 1.

The normal decoder 22 samples the encoded data at the clock rate of RCC2 and outputs the decoded data at the rate of RRC. The address mark checker 61 will find the formerly coded unique pattern and command the normal decoder 22 to start decoding the encoded data. (A detailed description will follow.)

Further descriptions of the relevant control signals such as RG, WG, and AMD relative to FIG. 3 and FIG. 4 are given below.

Before describing the operation of the encoder/decoder, an explanation of the term "code word" as used below is now given. "Code word" refers to a stream of bits divided or "framed" into words that are determined by convenience of processing without necessarily having any relationship to the content of the original data signals.

The code tables shows in FIGS. 5(a) through (c) illustrate the code tables and code word condition sets of different coding schemes. For example, it is seen from FIG. 5(b) that according to the 2,7 RLL-1 code, each time a bit sequence 000 is encountered at the point which marks the beginning of a word in the original NRZ bit stream, the 000 bit string is encoded into the code word 000100. If the NRZ bit sequence 0011 is encountered immediately following a word beginning point, the code word 00001000 is mapped. The matching is reversed during decoding. This conversion process applies to the other code tables in FIGS. 5(a) and 5(c).

Referring again to FIG. 5(b), the meaning of the phrase "code word condition set" accompanying a code table of a coding scheme is now explained. The phrase refers to compressed relations between the manifestations of a code word in two different codes. Firstly, referring to the "Encode" table of FIG. 5(b), when encoding NRZ with the 2,7 RLL-1 code table and naming the 3rd, 4th, 5th and 6th least significant bits of each 2,7 RLL-1 code word as $Q_0$, $Q_1$, $Q_2$ and $Q_3$, it is apparent that each NRZ code word corresponds to a certain one of the bit positions $Q_0$, $Q_1$, $Q_2$ or $Q_3$ in the equivalent 2,7 RLL code word being equal to 1, as summarized in the table of FIG. 5(b) labelled "Encode Compressed Relations". For instance, NRZ code word C000 corresponds to $Q_0 = 1$. Similarly, C10 correspondes to $Q_0 = 1$, C11 corresponds to $Q_1 = 1$, and C010 corresponds to $Q_3 = 1$.

Referring now to the "Decode" table of FIG. 5b, by assigning $Q_0$ and $Q_1$ the positions of the first and second least significant bits of the NRZ code word, there is also a compressed relation between the condition of 2,7 RLL-1 code word and the NRZ position bit pattern, as summarized in the table of FIG. 5(b) labelled "Decode Compressed Relations". For instance, C1000 corresponds to $Q_0 = 1$, $Q_1 = 1$. Also, C0100.$\overline{C0001}$ corresponds to $Q_1 = 1$. Here $\overline{C0001}$ refers to the complement of $\overline{C0001}$.

Similar practices can be exercised to obtain the code word condition sets for encoding NRZ data with the MFM and the 2,7 RLL-2 code table illustrated in FIGS. 5(a) and (c), respectively. In summary, the encode compressed relations illustrated in FIGS. 5(a), (b) and (c) map individual bits in the encoded bit stream from predetermined bit patterns in the data to be encoded. Similarly, the decode compressed relations illustrated in FIGS. 5(a), (b) and (c) map individual bits in the decoded bit stream from predetermined bit patterns in the data to be decoded.

Based upon the foregoing code table compression techniques and the consequent code word condition sets, the invention provides a two-level encoder and decoder logic architecture to perform code conversion for different coding schemes.

It is helpful to first point out the description of some control signals involved. NRZ data is encoded with either the MFM code, the 2,7 RLL-1 code or the 2,7 RLL-2 code, depending upon the states of the binary control signals RLL1, RLL2, MFM and MFMB in accordance with the following table:

TABLE I

| RLL1 | RLL2 | MFM | MFMB | Code Section |
|------|------|-----|------|--------------|
| 1 | 0 | 0 | 1 | 2,7 RRL-1 code table is chosen |
| 0 | 1 | 0 | 1 | 2,7 RLL-2 code table is chosen |
| 0 | 0 | 1 | 0 | MFM code table is chosen |

Figure 6C:
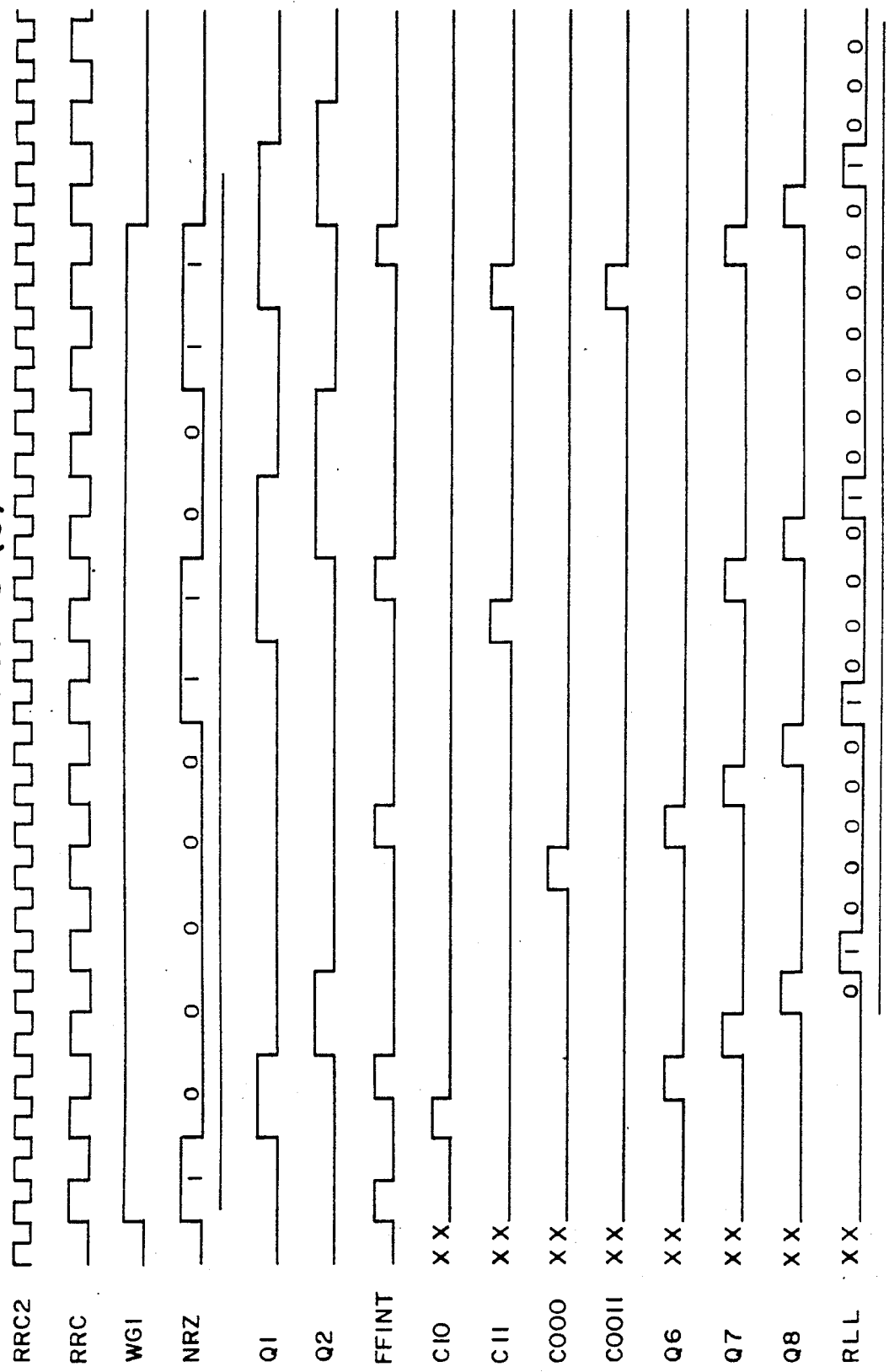
FIG. 6(c) is the corresponding timing diagram of various control signals representing the operation of the encoder of FIGS. 6(a) and (b)

The clock frequency, RRC2, is two times the clock pulse train frequency of RRC, as shown in FIG. 6(c) by the waveforms labelled "RRC" and "RRC2", respectively.

NRZ is the data to be encoded and the control signal WGI indicates the validity of the NRZ data as illustrated in FIG. 6c by the waveforms labelled "RRC", "WGI" and "NRZ", respectively.

Figure 7A:
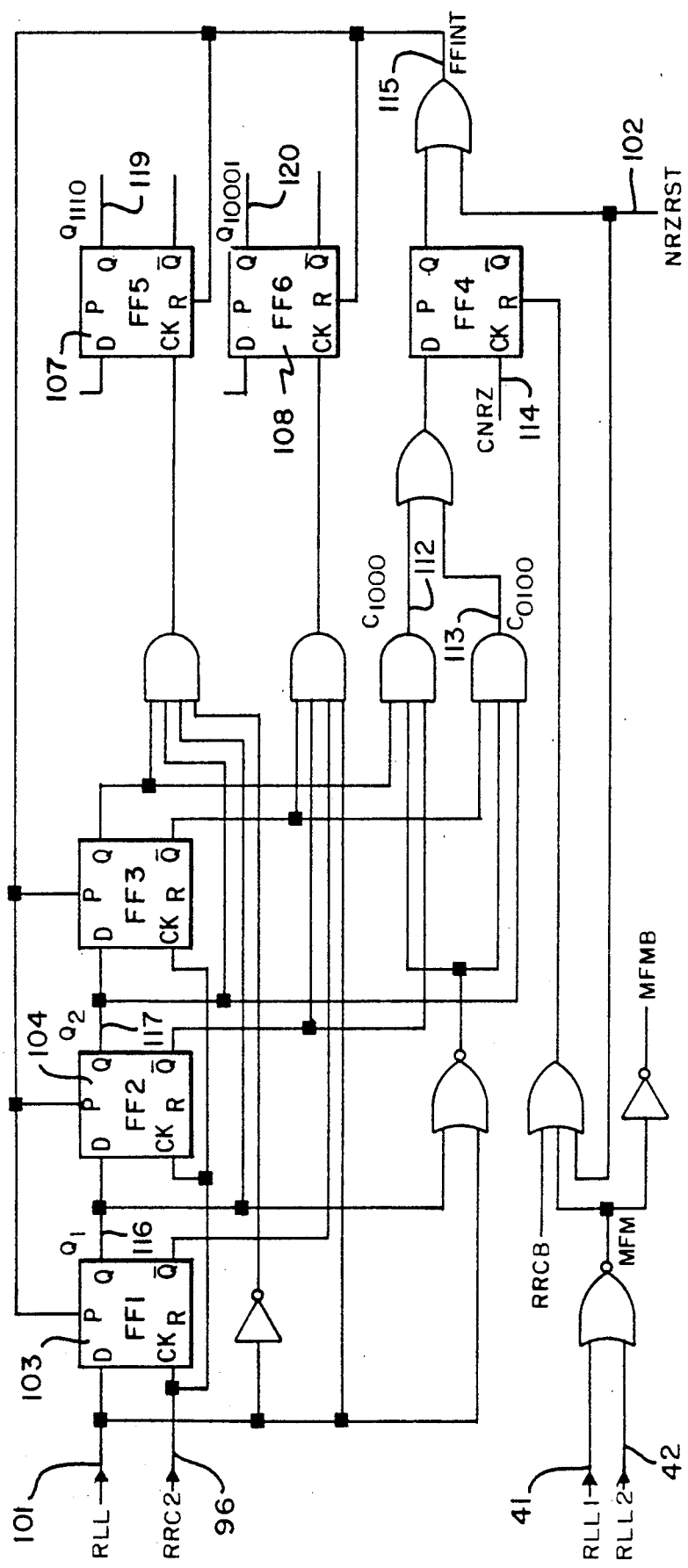
Figure 7B:
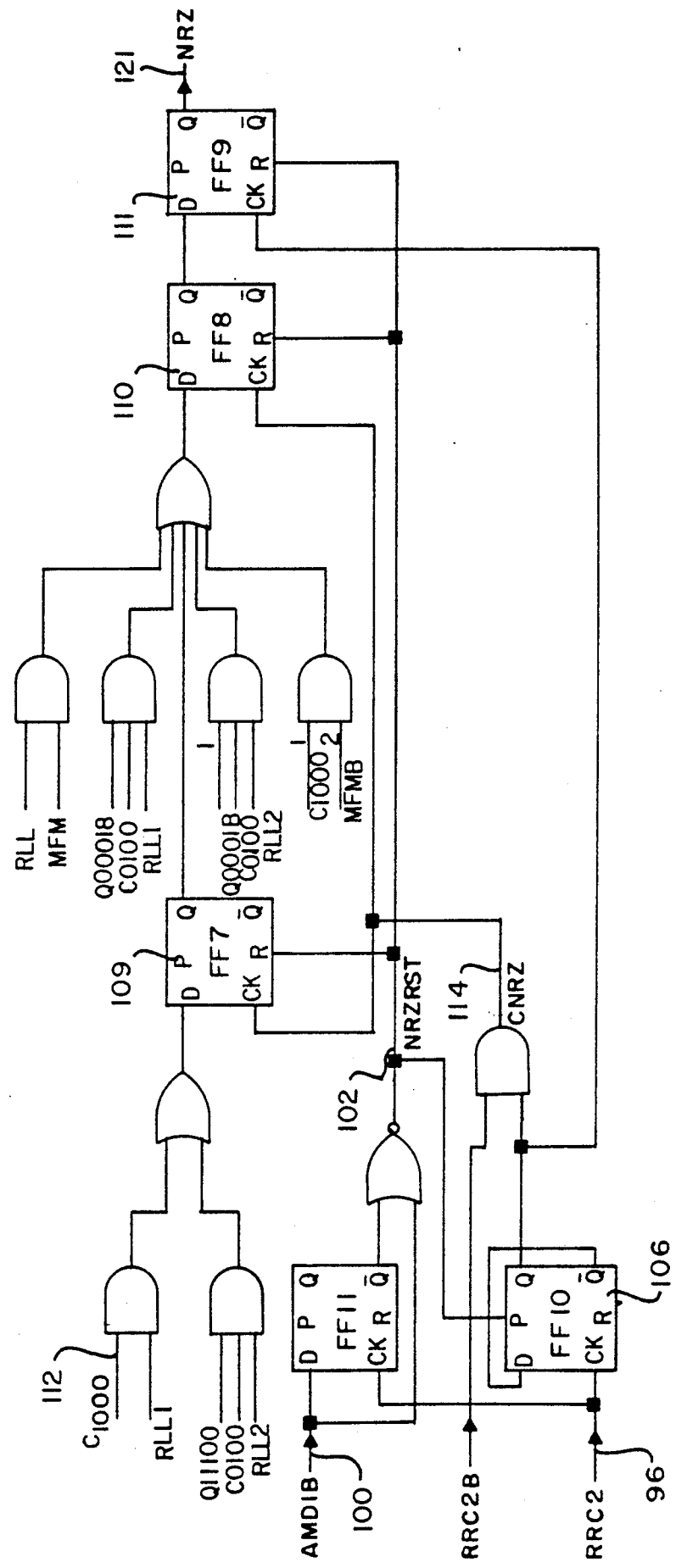
Figure 7C:
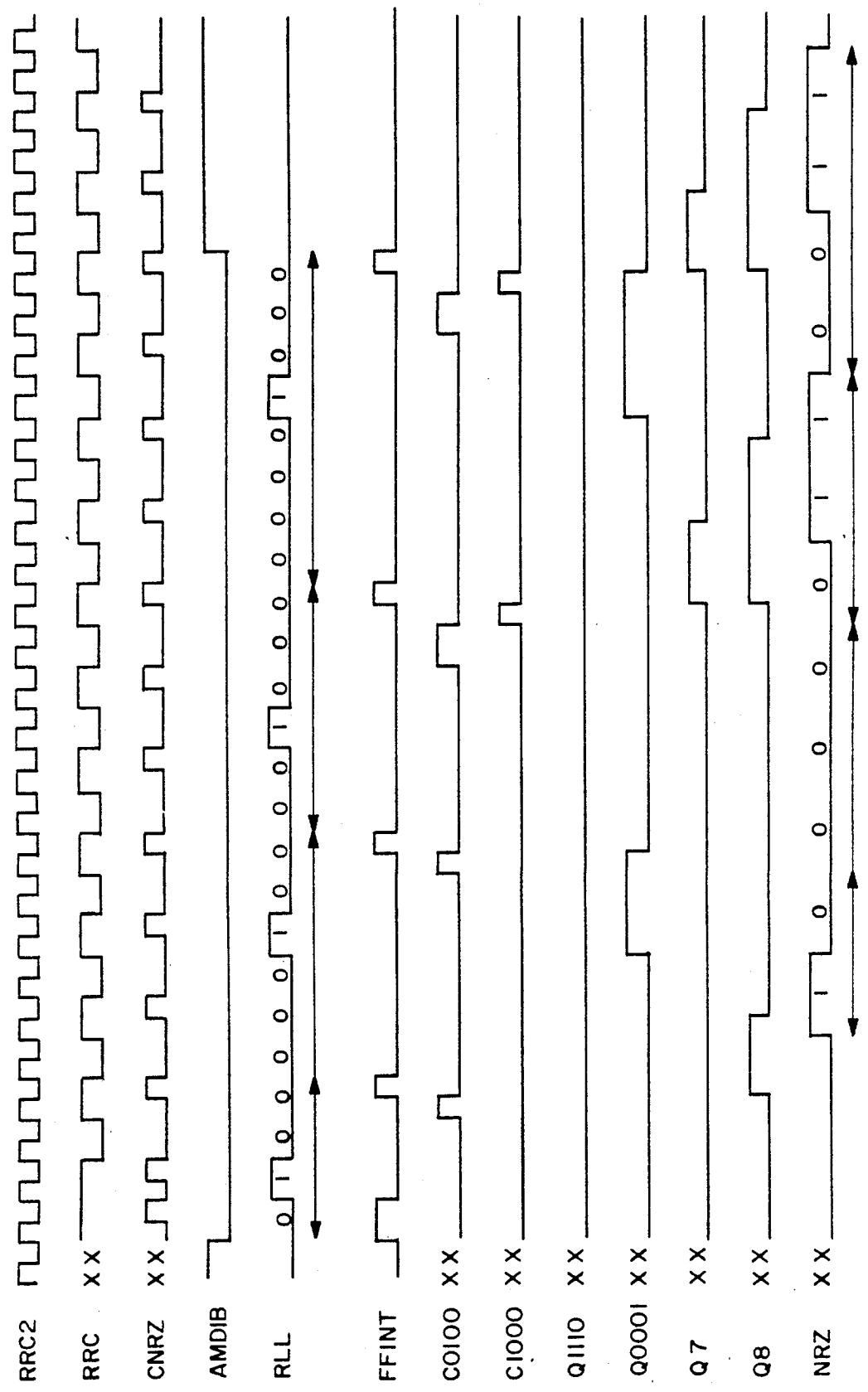
FIG. 7(c) is the corresponding timing diagram of various control signals representing the operation of the decoder of FIGS. 7(a) and (b)

The RLL is the run length limited encoded data to be decoded and the control signal "AMDIB" indicates the validity of the RLL data as illustrated in FIG. 7(c) by the waveforms labelled "RLL" and "AMDIB", respectively.

It should be noted that "B" stands for the complement of a signal. For example, RRC2B is the complement signal of RRC2, or AMDIB is the complement of the signal AMDI.

FIGS. 6(a) through (c) demonstrate an embodiment of the normal encoder 21 according to this invention. Both at the 1st and 2nd level of the encoder, there is a network of logic gates including clock pulsed flip-flops and gates whose functions and operations require no explanation to those skilled in the art. At initialization WGI 70 will first go high to indicate the NRZ data 71 is valid and it will remain high until all the NRZ data in a given block are encoded. A one RRC2-cycle-wide signal, RLLRST 72 will be generated at the rising edge of WGI 70 to set $Q_1$ (73), $Q_2$ (74), $Q_3$ (75) to 1 and reset $Q_4$ (76), $Q_6$ (77), $Q_7$ (78), $Q_8$ (79), RLL (79) to 0. The NRZ data 71 is shifted into FF1 (81), FF2 (82), FF3 (83) and FF4 (84) under the trigger of RRC (80). If the data (71) shifted in is equal to 10, 11, or 000, the C10 (85), C11 (86) or C000 (87), respectively, will become active (high). Then, after one RRC2 cycle, FFINT (88), will set $Q_1$ (73), $Q_2$ (74), $Q_3$ (75) to 1, reset $Q_4$ (76) to p0 and thus initialize the next code word detection. However, before FFINT (88) is active, C10 (85), C11 (86), C000 (87), C010 (90) and C0011 (91) are sampled to set the states of FF6 (92), FF7(93), FF8(94) and FF9(95). Then, under the control of RRC2(96), the encoded data will be shifted out through RLL (79). The setting of FF6 (92), FF7 (93), FF8 (94) and FFP (95) is according to the selected code table. For example, if the table 2,7 RRL−1 is chosen, C10 (85), C000 (87) will be used to set FF6 (92), C11 (86) to set FF7 (93) and C010 (90) to set FFP (95). And, if the table 2,7 RRL−2 is chosen, C11 (86) will be used to set FF6 (92), C10 (85) to set FF7 (93) and C0011 (91) or C000 (87) to set FF9 (95).

Encoder Code Word Test

The generation of the code word test signals C10, C11, C000, C010 and C0011 by the logic circuit of FIG. 6(a) as described above, is the function performed by the code word test 29 in the encoder 21 of FIG. 2. Each of the code word test signals (C10, C11, etc.) thus generated indicates the presence of a corresponding one of the NRZ code words (C10, C11, etc.) referred to in the encoding table of FIGS. 5(a), (b) and (c). In summary, the logic diagram of FIG. 6(a) corresponds to the code word test 29 of FIG. 2.

Encoder Multiplexer and Code Table

The generation of the RLL encoded bits at the RLL output 79 in accordance with the states of the code selection signals RLL1, RLL2, MFM and MFMB by the logic circuit of FIG. 6(b) as described above, is the function performed by the multiplexer and the code table 30 in the encoder 21 of FIG. 2. The code sel 1 and code sel 2 signals (41 and 42) applied to the encoder multiplexer and code table 30 of FIG. 2 correspond to the code select signals RLL1 and RLL2 of FIG. 6(b). FIG. 6(a) illustrates the logic circuit elements which generate the MFM and MFMB signals from the code select signals RLL1 and RLL2 for use in the logic circuit of FIG. 2. The logic circuit of FIG. 6(b) generates each bit of the encoded bit stream in response to the states of the code word test signals (C10, C11, etc.) generated by the logic circuit of FIG. 6(a) in accordance with one of the encode compressed relations of FIGS. 5(a), (b) or (c), depending upon which code table is specified by the two code select signals RLL1 and RLL2. In summary, the logic circuit of FIG. 6(b) corresponds to the encoder multiplexer and code table 30 of FIG. 2.

FIGS. 7(a) through (c) demonstrate an embodiment of the normal decoder 22 according to this invention. Both at the 1st and 2nd level of the decoder, there is a network of flip-flops and logic gates whose functions and operations are self-explanatory. At initialization, AMDIB 100 will first go low to indicate the RLL data is valid and it will remain low until all the RLL data in a given block are decoded. A one-RRC2 cycle-wide signal, NRZRST 102, will be generated at the falling edge of AMDIB. It will set FF1 (103), FF2 (104), FF3 (105), FF10 (106) to 1 and reset FF5 (107), FF6 (108), FF7 (109), FF8 (110), FF9 (111) to 0. The RLL data 101 is shifted into FF1 (103), FF2 (104) and FF3 (105) under the control of RRC2 (96) If data shifted in is equal to 1000 or 0100, then C1000 (112) or C0100 (113) will become active. At the same time, if CNRZ (114) is also active. FFINT (115) will go high and last for half a RRC2 cycle (96). FFINT (115) will set $Q_1$ (116), $Q_2$ (117), $Q_3$ (118) to 1, reset Q1110 (119), Q0001 (120) to 0 and initialize the next code word detection. However, before FFINT (115) is active, C1000 (112), C0100 (113), Q1110 (119) and Q0001 (120) are sampled to set the states of FF7 (109) and FF8 (110). Then, under the control of CNRZ (114) and RRC (80), the decoded data will be shifted out through NRZ output 121. The setting of FF7 (109) and FF8 (110) is determined by selected code table. For example, if the table 2,7 RLL−1 is chosen, C1000 (112) will be used to set FF7 (109) and (C0100.$\overline{Q0001}$) or C1000 (112) to set FF8 (110).

Decoder Code Word Test

The generation of the code word test signals C00, C1110, C0001, C0100, Q1110 and Q0001 by the logic circuit of FIG. 7(a) as described above, is the function performed by the code word test 31 in the decoder 22 of FIG. 2. Each of the code word test signals (C00, C1110, C001, etc.) thus generated indicates the presence of a corresponding one of the RLL code words or bit patterns referred to in the decoding tables of FIGS. 5(a), (b) and (c). In summary, the logic diagram of FIG. 7 (a) corresponds to the code word test 31 of FIG. 2.

Decoder Multiplexer and Code Table

The generation of the NRZ decoded bits at the NRZ output 121 in accordance with the states of the code selection signals RLL1, RLL2, MFM and MFMB by the logic circuit of FIG. 7(b), as described above, is the function performed by the multiplexer and code table 32 in the decoder 22 of FIG. 2. The code sel 1 and code sel 2 signals (41 and 42) applied to the decoder multiplexer and code table 32 of FIG. 2 correspond to the input logic signals RLL1 and RLL2 of FIG. 7(b). FIG. 7(a) illustrates the logic circuit elements which generate the MFM and MFMB signals from the code select signals RLL1 and RLL2 for use in the logic circuit of FIG. 7(b). The logic circuit of FIG. 7(b) generates each bit of the decoded bit stream in response to the states of the code word test signals (C00, C110, C0001, etc.) generated by the logic circuit of FIG. 7(b), in accordance with one of the decode compressed relations of FIGS. 5(a), (b) or (c), depending upon which code table is specified by the two code select signals RLL1 and RLL2. In summary, the logic circuit of FIG. 7(b) corresponds to the decoder multiplexer and code table 32 of FIG. 2.

In cooperating with the normal encoder and decoder illustrated above, the address mark generation/check and precompensation logic are further described below.

Address Mark Generator and Checker

Figure 8A:
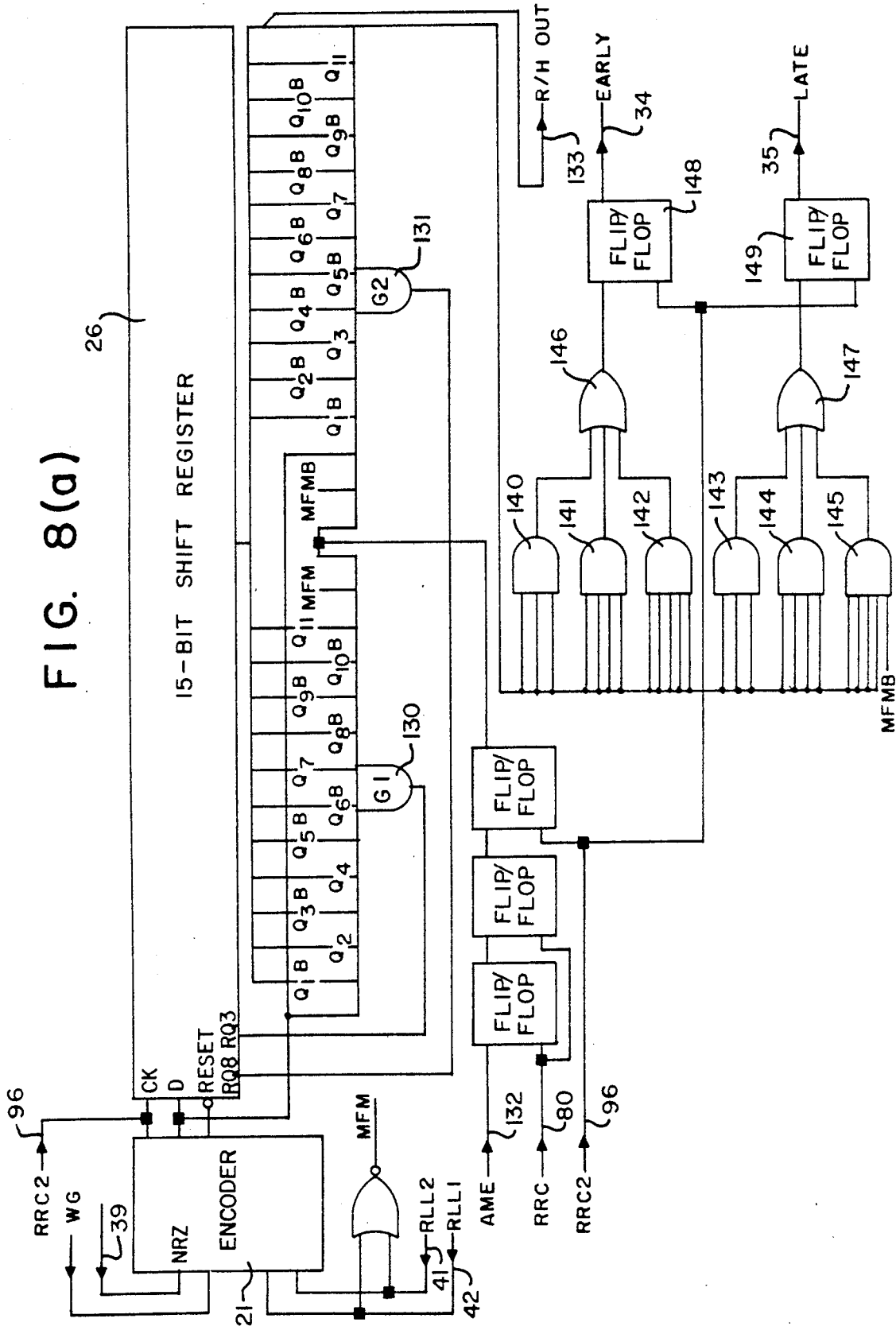
FIGS. 8(a) and (b) are detailed logic circuit diagrams of the address mark generation/check and precompensation circuits in the encoder and decoder of FIG. 2.
Figure 8B:
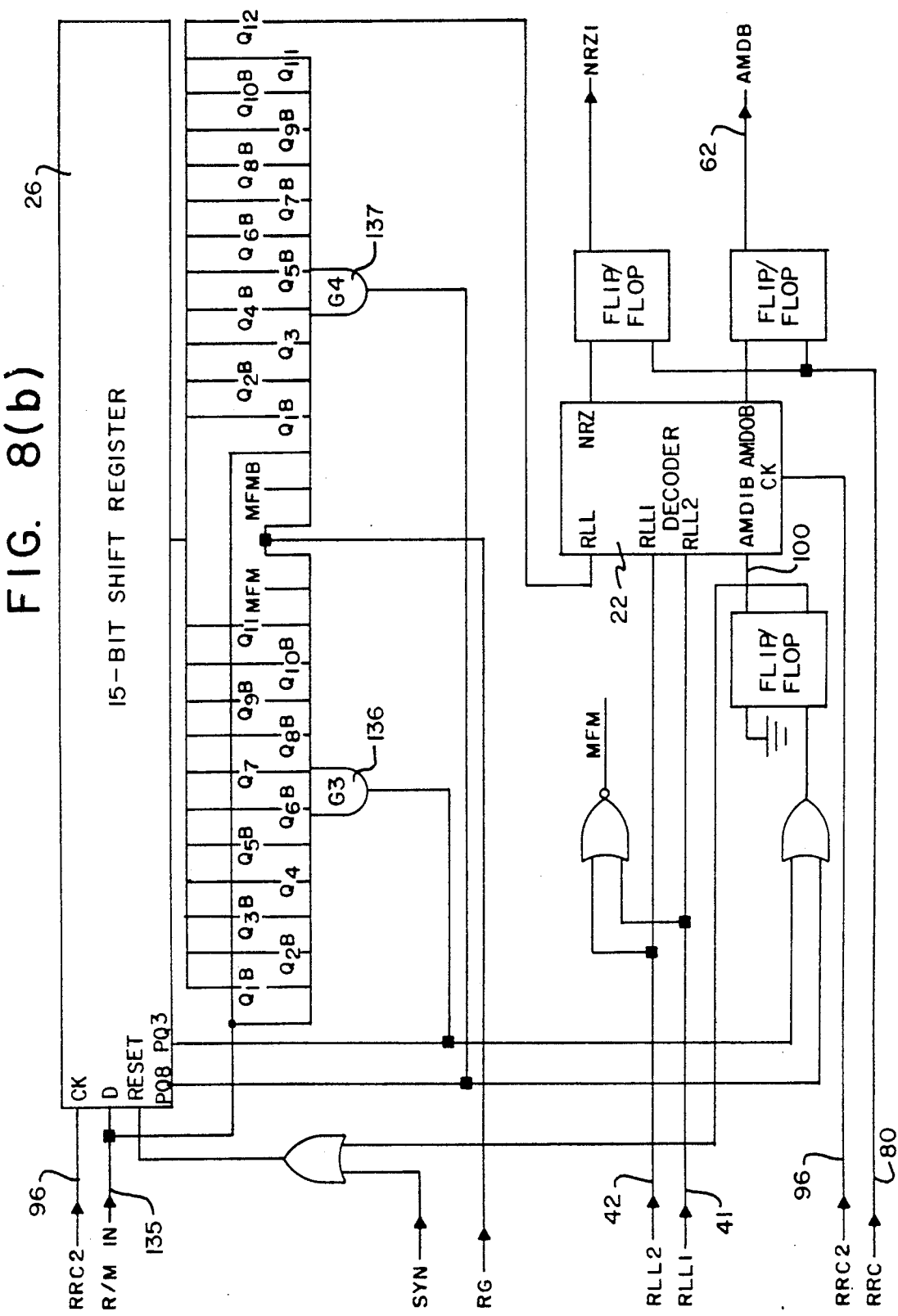

Referring to FIG. 8(a) and FIG. 8(b), the address mark is the unique data pattern that will not appear during normal encoding procedure. To generate the address mark, there should be a circuit to modify the encoded data. The most general method used is to remove a "1" from encoded string. For MFM code the unique pattern is 100010010001, and for 2,7 RLL it is 100000001001. In order to generate an address mark, we choose the hexidecimal number A1 for MFM AM encoding, the hexidecimal number AB for 2,7 RLL−1, and the hexidecimal number FE for 2,7 RLL−2 AM encoding. The number A1 in binary form is 10100001. After MFM encoding, it becomes the binary pattern 01000100101<u>0</u>1001. After the underlined "1" is removed (changed to zero), the remaining string 01000100010001001 contains the unique address mark pattern. Similarly, the hexidecimal numbers AB and FE, after 2,7 RLL−1 and 2,7 RLL−2 encoding, respectively, become the binary pattern 010001000<u>1</u>001000. After the underlined "1" is removed, the remaining string 010000000001001000 contains the unique address mark pattern for 2,7 RLL code. To generate the address mark, the encoded string will first be shifted into the 15-bit shift register 26. Then multiple-input AND gates G1 (130) and G2 (131) check the contents of the register 26 for the presence of the binary pattern (i.e., the unique pattern prior to removal of the binary "1"). Whenever the pattern is detected and AME 132 is active, the bit to be removed in the shift register 26 is reset to zero and the result (the address mark) is shifted out through R/M OUT 133. In order to check (detect) an address mark, the data is shifted into the register 26 through R/M IN 135. Then multiple-input AND gates G3 (136) and G4 (137) check contents of the register for the presence of the address mark. After the AM is found, the AMDIB 100 becomes active low to enable the decoder 22, and the "1" bit (which was removed during AM generation) is recovered. Then the data string is shifted into the decoder 22 and decoded.

The diagram of FIG. 8(a) indicates that the G1 AND gate 130 and the G2 AND Gate 131 receive at their multiple inputs the logic values of the contents of some of the individual cells of the register 26 and the inverted logic values of the contents of other individual cells of the register 26. Thus, for example, the G1 AND gate 130 receives at its multiple inputs the logic values (states) of the cells (or flip-flops) $Q_2$, $Q_4$, $Q_7$ and $Q_{11}$ of the register 26 and the inverted logic values of the cells $Q_1$, $Q_3$, $Q_5$, $Q_6$, $Q_8$, $Q_9$, and $Q_{10}$ of the register 26. (The inversion is indicated in FIG. 8(a) by the symbol "B", as in $Q_1B$, $Q_3B$, $Q_5B$, $Q_6B$, $Q_8B$, $Q_9B$, and $Q_{10}B$.) The connection of the multiple inputs of the G2 AND gate 131 of FIG. 8(a), the G3 AND gate 136 of FIG. 8(b) and the G4 AND gate 137 are indicated in the drawings in similar fashion.

To precompensate the data shift on disk, this circuit generates the precompensation signals Early 34 and Late 35, for an external data precompensation circuit (not shown). The generation of these signals is based on the rules embodying well-known principles of magnetic disk recording precompensation and is illustrated in the diagram of FIG. 9 and the table of FIG. 9(b).

Figures 9A, 9B:
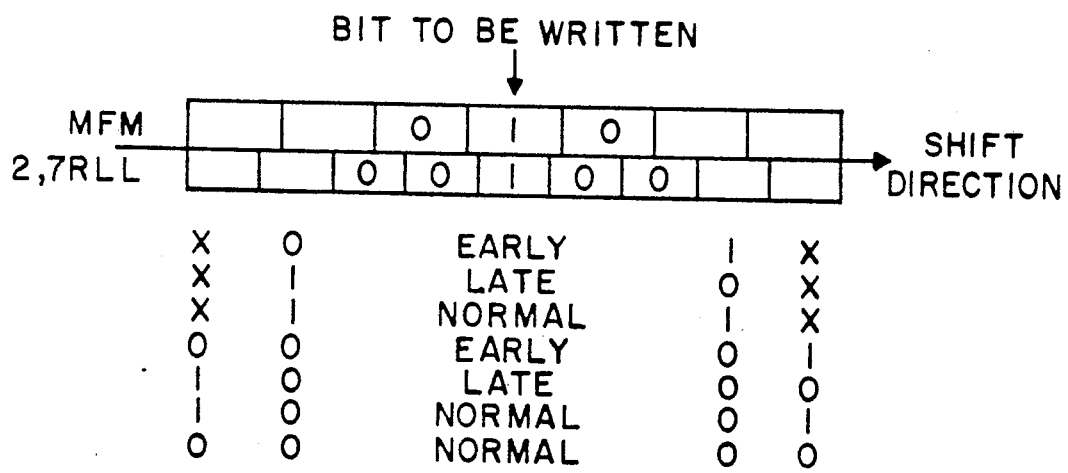
FIG. 9 illustrates the rules governing the generation of the precompensation control signals by the circuits of FIGS. 8(a) and (b).

The diagram of FIG. 9(a) illustrates which precompensation condition (either early, late or normal) obtains for each one of various bit patterns for both MFM and 2,7 RLL codes. The table of FIG. 9(b) illustrates how the precompensation signals "early" and "late" (34 and 35) are used to specify each one of the three precompensation conditions (early, late or normal) detected in accordance with the diagram of FIG. 9(a).

Take the MFM case as an example in FIG. 9(a). If there are seven bits to be written to the disk and the current bit to be written is pointed to by the arrow, the rules stipulate that an early signal is generated to the external circuits if the leading two bits are 1x and the two trailing two bits are x0 (where x stands for don't care) or if the leading two bits are 01 and the trailing two bits are 00. In the similar fashion, a normal signal turns up (implying neither early nor late precompensation is required) if the leading two bits are 1x and the trailing two bits are x1, or the leading two bits are 01 and the trailing two bits are 10, or the leading two bits are 00 and the trailing two bits are also 00. The table of FIG. 9(b) shows that four types of output signals (namely, early, late, normal, don't care) are represented at two output terminals, EARLY 34 and LATE 35. The interpretation applies similarly to the 2,7 RLL codes.

The precompensation circuit comprising AND gates (140-145), OR gates (146-147) and two flip-flops (148-149) to perform the above-described rules is shown in FIG. 8(a).

The early and late signals 34, 35 are transmitted to a disk controller precompensation circuit (not shown) of the type well-known in the art.

In accordance with the embodiment stated above, the NRZ inputs are converted to and from the MFM, 2,7 RLL−1 and 2,7 RLL−2 codes in the two level encoder 21 and decoder 22. FIG. 6(c) and FIG. 7(c) provide and example of the timing diagrams in a complete operation of the invented encoder 21 and decoder for the 2,7 RLL−1 code. Those ordinarily skilled in the art may readily trace out similar timing diagrams for the MFM and 2,7 RLL−2 codes.

While the invention has been described with reference to a particular embodiment, it should be understood that various changes and modifications may be made without departing from the spirit of the disclosed invention and the scope of the following claims.

What is claimed:

1. An encoder/decoder apparatus for encoding data which is to be encoded prior to insertion in a channel and for decoding encoded data received from said channel, said apparatus comprising:
   means for generating a code selection signal specifying one of a plurality of compressed code tables;
   an encoder comprising:
     encoder code word test means for detecting in said data to be encoded any one of a plurality of code word conditions comprising a first set of code word conditions;
     encoder code table multiplexer means for generating an encoded bit stream from the code word conditions of said first set detected in said data by said code word test means in accordance with the one compressed code table specified by said code selection signal;
   a decoder comprising:
     decoder code word test means for detecting in said encoded data any one of a plurality of code word conditions comprising a second set of code word conditions,
     code table multiplexer means for generating a decoded bit stream from the code word conditions of said second set detected in said encoded data by said decoder code word test means in accordance with the one compressed code table specified by said code selection signal.

2. The encoder/decoder apparatus of claim 1, wherein said first and second sets of code word conditions comprise first and second sets of predetermined bit patterns, and wherein each one of said compressed code tables maps individual bits in said encoded and decoded bit streams from said first and second sets of predetermined bit patterns, respectively.

3. The encoder/decoder apparatus of claim 2, wherein said data to be encoded comprises data already encoded in a first code, said plurality of compressed code tables correspond to conversions between first code and a corresponding plurality of other codes, said first set of predetermined bit patterns comprise code words of said first code and said second set of predetermined bit patterns comprise code words of one of said other codes corresponding to the selected one of said compressed code tables.

4. The encoder/decoder apparatus of claim 3, wherein said first code is an NRZ code and said other codes comprise an MFM code and an RLL code.

5. The encoder/decoder apparatus of claim 1, wherein said apparatus comprises a common shift register shared by said encoder and said decoder, wherein said encoder and decoder code word test means inspects data stored in said common register to detect said code word conditions, said apparatus further comprising:
   means connected to said common shift register for generating an address mark during encoding of said data, comprising:
     means for determining the presence in said common register of data corresponding to a predetermined numerical value; and
     means for inverting a predetermined bit of the data in said common register upon said predetermined numerical value being detected by said means for determining.

6. The encoder/decoder apparatus of claim 5, wherein said predetermined numerical value is one of a plurality of hexidecimal numbers corresponding to said plurality of compressed code tables, one of said hexidecimcal numbers being selected in accordance with said code selection signal.

7. The encoder/decoder apparatus of claim 5, further comprising:
   means for detecting an address mark in said common register during decoding of said data, comprising:
     means for determining the presence in said common register of data corresponding to a predetermined numerical value having a predetermined one of its bits inverted therefrom; and
     means for re-inverting said predetermined bit in said common register in response to said numerical value with said inverted bit being detected.

8. The encoder/decoder apparatus of claim 5, further comprising means for generating from said data in said common shift register a precompensation signal during encoding of said data, said precompensation signal generating means comprising means for matching the pattern of bits surrounding each bit in said common shift register with a plurality of predetermined precompensation bit patterns, and transmitting a logic signal representing either a normal, early or late precompensation condition, depending upon which one of said predetermined precompensation bit patterns matches said surrounding bit pattern.

9. The encoder/decoder apparatus of claim 1, wherein:
said encoder code word test means comprises a first network of connected flip-flop means, said first network operative to shift said data to be encoded in synchronism with a first clock signal and for generating thereform code word condition signals indicative of said detected code word conditions,
said encoder code table multiplexer means comprise a second network of connected flip-flop means connected to receive said code work condition signals from said first network and responsive to said code selection signal for generating said encoded bit stream and for shifting out said encoded bit stream in synchronism with a second clock signal,
said apparatus further comprising means for selectively initializing the flip-flop means of said first network in synchronism with said second clock signal, wherein said second clock signal is characterized by a clock rate twice that of said first clock signal.

10. The encoder/decoder apparatus of claim 9, wherein:
said decode code word test means comprises a third network of connected flip-flop means, said third network operative to shift said data to be decoded in synchronism with said second clock signal and for generating therefrom code word condition signals indicative of said detected code word conditions,
said decoder code table multiplexer means comprise a fourth network of connected flip-flop means connected to receive said code word condition signals from said third network and responsive to said code selection signal for generating said decoded bit stream and for shifting out said encoded bit stream in synchronism with said first clock signal,
said apparatus further comprising means for selectively initializing the flip-flop means of said third network in synchronism with said second clock signal.

11. A method for encoding data which is to be transmitted through a channel, comprising: generating a code selection signal specifying one of a plurality of compressed code tables;
first detecting in said data which is to be encoded any one of a plurality of code word conditions comprising a first set of code word conditions;
first producing an encoded bit stream from the code word conditions of said first set detected in said data by said first detecting step in accordance with said one compressed code table specified by said code selection signal of said generating step; and
transmitting said encoded bit stream through said channel;
said method further comprising the following steps for decoding data received from said channel;
receiving a bit stream from said channel;
second detecting in the bit stream received from said channel any one of a plurality of code word conditions comprising a second set of code word conditions;
second producing a decoded bit stream from said code word conditions of said second set detected by said second detecting step in accordance with said one compressed code table specified by said code selection signal of said generating step.

12. The method of claim 11, wherein said first and second sets of code word conditions comprise first and second sets of predetermined bit patterns, and wherein each one of said compressed code tables maps individual bits in said encoded and decoded bit streams from said first and second sets of predetermined bit patterns, respectively.

13. The method of claim 11, wherein said transmitting step is preceded by the following steps:
first determining the presence in said encoded bit stream of data corresponding to a predetermined numerical value; and
inverting a predetermined bit of said encoded bit stream upon said first determining step detecting the presence of said predetermined numerical value.

14. The method of claim 13, wherein said receiving step is followed by the following steps:
second determining in said data received from said channel the presence of data corresponding to a predetermined numerical value having a predetermined one of its bits inverted therefrom; and
re-inverting said predetermined bit in response to said second determining step detecting said predetermined numerical value with said inverted bit.

15. The method of claim 13 further comprising:
matching a pattern of bits surrounding each bit in said encoded bit stream with one of a plurality of predetermined precompensation bit patterns, said plurality of precompensation bit patterns comprising normal, early and late precompensation bit patterns; and
transmitting a logic signal representing either a normal, early or late precompensation condition, depending upon which one of said normal, early or late precompensation bit patterns, respectively, matches said surrounding bit pattern of said encoded bit stream.

* * * * *